(12) United States Patent
Zhao et al.

(10) Patent No.: US 12,274,119 B2
(45) Date of Patent: Apr. 8, 2025

(54) DISPLAY SUBSTRATE WITH A PLURALITY OF THROUGH HOLES AND DISPLAY DEVICE

(71) Applicants: Chengdu BOE Optoelectronics Technology Co., Ltd., Sichuan (CN); BOE Technology Group Co., Ltd., Beijing (CN)

(72) Inventors: Erjin Zhao, Beijing (CN); Zhiliang Jiang, Beijing (CN); Qingqing Yan, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 545 days.

(21) Appl. No.: 17/607,366

(22) PCT Filed: Dec. 23, 2020

(86) PCT No.: PCT/CN2020/138553
§ 371 (c)(1),
(2) Date: Oct. 28, 2021

(87) PCT Pub. No.: WO2022/133781
PCT Pub. Date: Jun. 30, 2022

(65) Prior Publication Data
US 2022/0399520 A1 Dec. 15, 2022

(51) Int. Cl.
*H10K 50/84* (2023.01)

(52) U.S. Cl.
CPC .................... *H10K 50/84* (2023.02)

(58) Field of Classification Search
CPC ...................................................... H10K 50/84
(Continued)

(56) References Cited

U.S. PATENT DOCUMENTS

| | | | |
|---|---|---|---|
| 2014/0062193 A1* | 3/2014 | Chen | H02J 4/00 307/31 |
| 2014/0062293 A1 | 3/2014 | Moon | |

(Continued)

FOREIGN PATENT DOCUMENTS

| | | |
|---|---|---|
| CN | 107946317 A | 4/2018 |
| CN | 109411619 A | 3/2019 |

(Continued)

*Primary Examiner* — Xia L Cross
(74) *Attorney, Agent, or Firm* — IPro, PLLC (57) ABSTRACT

Provided are a display substrate and a display device. The display substrate includes a display region and a peripheral region surrounding the display region. The peripheral region includes a first edge extending in a first direction, a second edge extending in a second direction and a transition edge between the first edge and the second edge, and the first direction and the second direction intersect. The display substrate includes a base substrate and an encapsulation layer located on the base substrate, the display substrate further includes multiple through holes, the through holes are located between the base substrate and the encapsulation layer, the through holes include a first through hole located at the transition edge, the first through hole includes first target through holes, and length directions of the first target through holes intersect with the first direction and the second direction.

11 Claims, 4 Drawing Sheets

(58) Field of Classification Search
USPC .......................................................... 257/40
See application file for complete search history.

(56) References Cited

U.S. PATENT DOCUMENTS

| | | |
|---|---|---|
| 2019/0157311 A1 | 5/2019 | Zhang |
| 2020/0026332 A1* | 1/2020 | Hong .................... G06F 1/1626 |
| 2020/0258958 A1 | 8/2020 | Gai et al. |
| 2022/0085305 A1 | 3/2022 | Zhao et al. |
| 2022/0093895 A1 | 3/2022 | Zhang et al. |

FOREIGN PATENT DOCUMENTS

| | | | |
|---|---|---|---|
| CN | 112002831 A | 11/2020 | |
| CN | 112071883 A | 12/2020 | |
| CN | 112563309 A | 3/2021 | |

* cited by examiner

DISPLAY SUBSTRATE WITH A PLURALITY OF THROUGH HOLES AND DISPLAY DEVICE

This application is the U.S. national phase of PCT Application No. PCT/CN2020/138553 filed on Dec. 23, 2020, which is incorporated herein by reference in its entirety.

TECHNICAL FIELD

The present disclosure relates to the field of display technologies, and in particular to a display substrate and a display device.

BACKGROUND

OLED (Organic light-emitting diode) display technology has the advantages of high brightness, low power consumption, fast response, and high definition, etc. With the development and maturity of the OLED display technology, OLED display devices becomes more and more popular.

SUMMARY

In a first aspect, embodiments of the present disclosure provide a display substrate which includes a display region and a peripheral region surrounding the display region. The peripheral region includes a first edge extending in a first direction, a second edge extending in a second direction and a transition edge between the first edge and the second edge, and the first direction and the second direction intersect. The display substrate includes a base substrate and an encapsulation layer located on the base substrate, the display substrate further includes a plurality of through holes, the through holes are located between the base substrate and the encapsulation layer, the through holes include a first through hole located at the transition edge, the first through hole includes first target through holes, a cross section of each of the first target through holes in a direction parallel to the base substrate is of a long strip shape, and length directions of the first target through holes intersect with the first direction and the second direction.

Optionally, the length directions of at least some of the first target through holes intersect with each other.

Optionally, an angle between the length direction of the first target through hole and the second direction gradually increases in a direction from the first edge to the second edge.

Optionally, the length directions of the first target through holes are perpendicular to the transition edge.

Optionally, the through holes further include a second through hole at the first edge, the second through hole includes a second target through hole, a cross section of the second target through hole in the direction parallel to the base substrate is of a long strip shape, and a length direction of the second target through hole is along the second direction.

Optionally, the through holes further include a third through hole at the second edge, the third through hole includes a third target through hole, a cross section of the third target through hole in the direction parallel to the base substrate is of a long strip shape, and a length direction of the third target through hole is along the first direction.

Optionally, the display substrate includes the base substrate, and a first source-drain metal layer, a first planarization layer, a second source-drain metal layer, a second planarization layer, and a first electrode layer that are stacked in sequence in a direction away from the base substrate, and the encapsulation layer is located at a side of the first electrode layer away from the base substrate.

Optionally, the first target through hole includes bridging holes, the bridging holes penetrate the second planarization layer, and the first electrode layer is electrically connected to the second source-drain metal layer through the bridging holes.

Optionally, the through holes further include vent holes, and the vent holes penetrate at least one of the first source-drain metal layer or the second source-drain metal layer.

Optionally, the through holes are arranged in columns along a straight line to form a plurality of through hole columns, the vent holes and the bridging holes are alternately arranged in an extending direction of the through hole columns, and the vent holes and the bridging holes are alternately arranged in an arrangement direction of the through hole columns.

Optionally, the through holes in each of the through hole columns include one kind of the vent holes and the bridging holes, and a vent hole column formed by the vent holes and a bridging hole column formed by the bridging holes are alternately arranged in the arrangement direction of the through hole columns.

Optionally, at least some of the bridging holes in each of the bridging hole columns are communicating with each other.

In a second aspect, embodiments of the present disclosure further provide a display device including the display substrate as described in any embodiment in the first aspect.

The display substrate in the embodiments of the present disclosure includes a plurality of through holes, the through holes are arranged in columns along a straight line to form a plurality of through hole columns, and the extension direction of the through holes is along the extension direction of the through hole columns. The through hole columns include a first through hole column located at a transition edge, and the extension direction of the first through hole column intersects with both the first direction and the second direction. In this way, in the process of forming the encapsulation layer, the formed through holes equate to diversion trenches, which can cause materials of the encapsulation layer to flow to a certain extent along the extension direction of the through holes and in a direction close to the transition edge, help to improve the fluidity of the materials of the encapsulation layer and the uniformity and flatness of the thickness of the encapsulation layer, thereby improving the encapsulation effect, and improving the reliability of the display substrate.

BRIEF DESCRIPTION OF THE DRAWINGS

In order to illustrate technical solutions of embodiments of the present disclosure more clearly, a brief description will be given below with reference to the accompanying drawings which are required to be used in the description of the embodiments of the present disclosure. It is obvious that the drawings in the following description are only some embodiments of the present disclosure, and based on these drawings, a person skilled in the art can obtain other drawings without involving creative efforts.

DETAILED DESCRIPTION

The technical solutions of embodiments of the present disclosure will be described fully and completely hereinafter with reference to the accompanying drawings. It is obvious that the described embodiments are some embodiments, but not all embodiments of the present disclosure. All other embodiments obtained by those of ordinary skill in the art based on the embodiments in the present disclosure without creative work shall fall within the protection scope of this application.

Embodiments of the present disclosure provide a display substrate.

Figure 1:
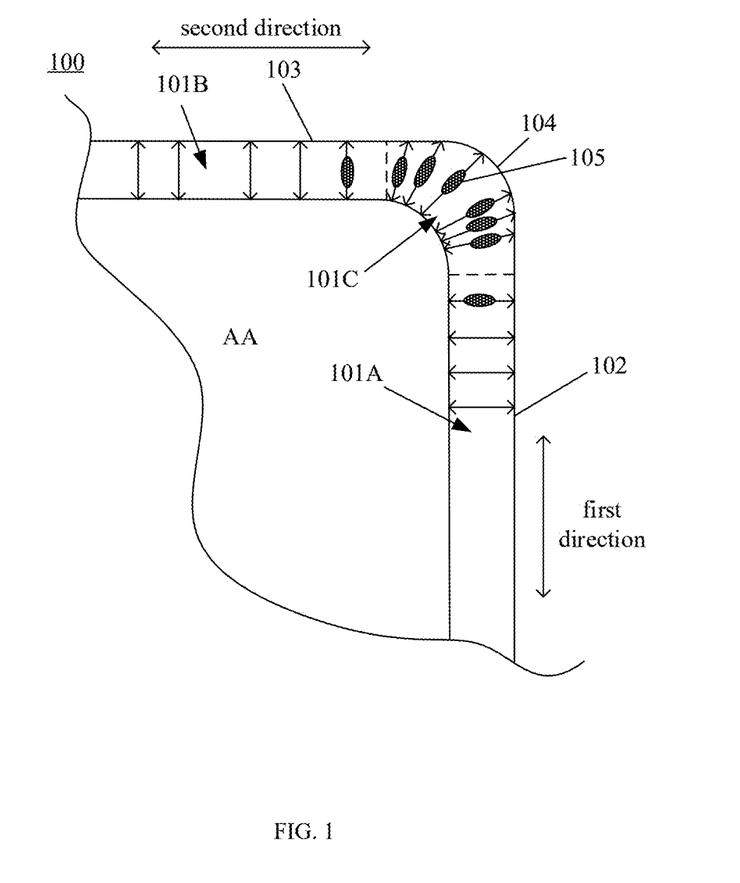
FIG. 1 is a partial structural diagram of a display substrate in an embodiment of the present disclosure.

As shown in FIG. 1, in an embodiment, the display substrate 100 includes a display region AA and a peripheral region surrounding the display region AA, and the peripheral region includes a first edge 102 extending in a first direction, a second edge 103 extending in a second direction, and a transition edge 104 between the first edge 102 and the second edge 103. The first direction and the second direction intersect with each other, herein, the intersecting of the first direction and the second direction means that the first direction and the second direction are neither parallel nor overlapped, but intersect at a certain angle.

Taking the display substrate 100 shown in FIG. 1 as an example for illustration, in the present embodiment, the display region AA of the display substrate 100 has a substantially rounded rectangular shape, and the corner region of the display substrate 100 has a rounded shape.

The right edge of the display substrate 100 is a first edge 102, and the first direction refers to the longitudinal direction shown in FIG. 1. The upper edge of the display substrate 100 is a second edge 103, and the second direction refers to the horizontal direction shown in FIG. 1. The rounded corner refers to a transition edge 104 of the display substrate 100. In the embodiment, the first and second directions are substantially perpendicular.

The peripheral region further includes a first peripheral region 101A adjoining the first edge 102, a second peripheral region 101B adjoining the second edge 103, and a third peripheral region 101C adjoining the transition edge 104.

Figure 2:
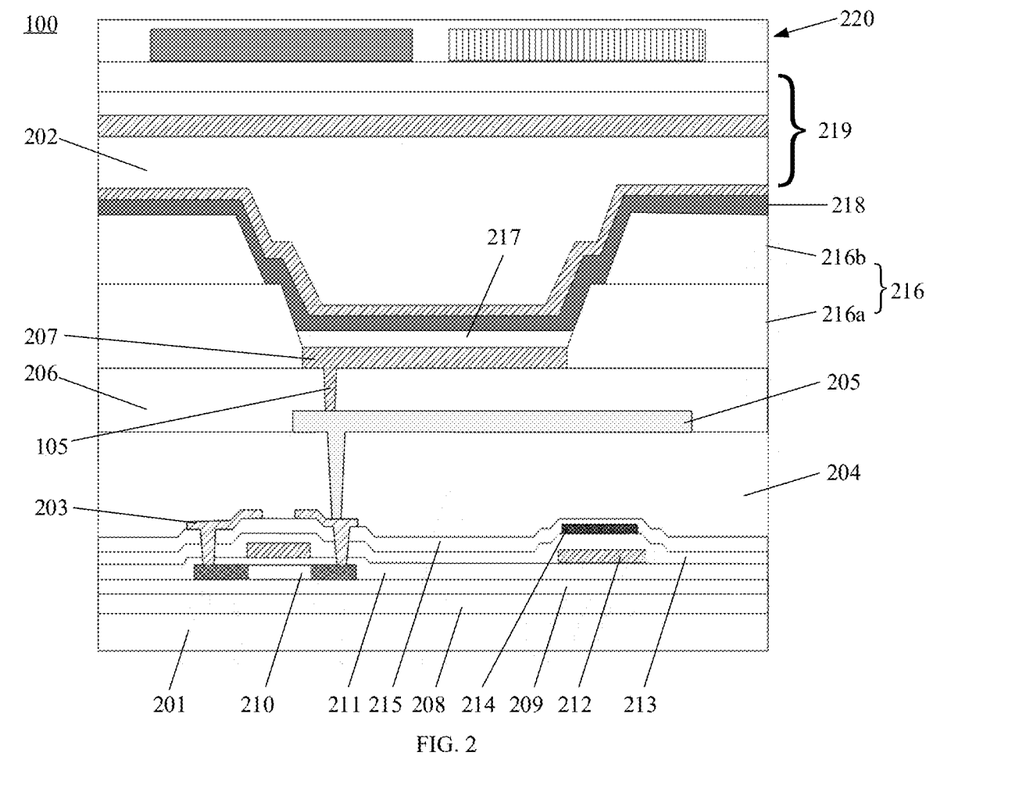
FIG. 2 is a structural diagram of a display substrate in an embodiment of the present disclosure.

As shown in FIG. 2, the display substrate 100 includes a base substrate 201 and an encapsulation layer 202 on the base substrate 201, and the base substrate 201 may be a rigid base substrate 201 or a flexible base substrate 201.

The display substrate 100 further includes a plurality of through holes, where the through holes are located between the base substrate 201 and the encapsulation layer 202. The through holes include a first through hole located at the transition edge 104, the first through hole includes first target through holes 105, cross sections of the first target through holes 105 in a direction parallel to the base substrate 201 are in a long strip shape, and a length direction of the first target through hole 105 intersect with both the first direction and the second direction.

As shown in FIG. 1, extension directions of the first target through holes 105 at the transition edge 104 are illustratively represented in the embodiment by a double arrow located at the third peripheral region 101C. In the region where the transition edge 104 is located, the direction in which the first target through hole 105 extends intersects both the first direction and the second direction. It can be understood that the first target through hole 105 extends in a direction towards the transition edge 104.

The encapsulation layer 202 is formed through an inkjet printing (IJP) process, and the encapsulation layer 202 after the inkjet printing needs to be leveled to ensure the encapsulation effect, where the leveling refers to a process in which materials of the inkjet printing is gradually shrunk into a minimum area due to the surface tension after printing but before being dried into a film.

Affected by the flatness of other film layers between the encapsulation layer 202 and the base substrate 201, the leveling of the encapsulation layer 202 may have certain non-uniformity, which becomes more pronounced as the thickness of the encapsulation layer 202 decreases. It should be understood that the thickness of the encapsulation layer 202 of the display region AA is generally relatively large, and the encapsulation effect is relatively good, and as the distance away from the display region AA increases, the thickness of the encapsulation layer 202 gradually decreases in the peripheral region of the display substrate 100. After analysis, the thickness of the encapsulation layer 202 may be only 2 to 5 micrometers in the border region of the display substrate 100, therefore, the uniformity of the encapsulation layer 202 may be greatly affected.

It may be understood that the through holes of the display substrate 100 may be also located in the display region AA. It can be seen from the above described analysis that the thickness of the encapsulation layer 202 in the display region AA is relatively large, and the encapsulation effect is relatively good. Therefore, the technical solutions in the present embodiments mainly aim at the peripheral region of the display substrate 100, the through holes in the present embodiments particularly refer to the through holes located in the peripheral region of the display substrate 100, and in particular, the through holes are located between the display region AA of the display substrate 100 and a barrier structure (dam).

Since shapes of various parts of the display substrate 100 are different, the flow directions of the materials of the encapsulation layer 202 in different regions may be also different. Particularly, in the edge region of the display substrate 100, the flow direction of the material of the encapsulation layer 202 in a third peripheral region 101C corresponding to a transition edge 104 is different from flow directions of the materials of the encapsulation layer 202 in the first peripheral region 101A and the second peripheral region 101B corresponding to the first edge 102 and the second edge 103 that are straight-line shaped, due to the presence of the rounded corner structure.

By adjusting the length direction of the first target through hole 105 to cross both the first direction and the second direction, the region corresponding to the first target through hole 105 serves as a diversion trench. It should be noted that, the first target through holes 105 may be filled with other structures, and therefore, the first target through holes 105 may not be directly used as the diversion trenches, but a shape of the other structure located on a side of the first target through holes 105 away from the base substrate 201 is changed accordingly because of the first target through holes 105, the regions corresponding to the first target through holes 105 are used as the diversion trenches. In this way, during the process of forming the encapsulation layer 202, the diversion trenches enable certain adjustment of the flow directions of the materials of the encapsulation layer 202 located in the third peripheral region 101C, thereby helping to improve the fluidity of the material of the encapsulation layer 202, and making the thickness of the encapsulation layer 202 more uniform, so as to improve the encapsulation effect.

Referring back to FIG. 1, in some embodiments, length directions of at least some of the first target through holes 105 intersect with each other.

In an embodiment, the number of the first target through holes 105 in the third peripheral region 101C is plural. In some embodiments, the first target through holes 105 are arranged in columns along a straight line to form a plurality of first target through hole 105 columns, the length direction of the first target through hole 105 is along the direction of the first target through hole 105 column, and this arrangement is merely exemplary in the embodiments. Obviously, in some other embodiments, the first target through holes 105 may not be arranged in columns; or the first target through holes 105 may be arranged in columns, and the length direction of the first target through hole 105 is different from the extension direction of the first target through hole 105 column.

In an embodiment, the length directions of the first target through holes 105 are correspondingly provided according to the positions of the first target through holes 105, namely, the extension direction of the first target 105 through hole column is adjusted, and the first target through holes 105 are used as the diversion trenches of the materials of the encapsulation layer 202, so that the materials of the encapsulation layer 202 can flow in different directions, which helps to improve the uniformity and consistency of the flows of the materials of the encapsulation layer 202 towards various regions of the third peripheral region 101C, thereby helping to improve the uniformity of the thickness of the encapsulation layer 202 of the third peripheral region 101C.

In addition, the improving the uniformity of the thickness of the encapsulation layer 202 also helps to improve the height difference of subsequent traces, for example, it may be possible to reduce the height difference of traces made by the FMLOC (Flexible Multi-Layer On Cell) process, and further reduce the possibility of the traces being short-circuited due to a large height difference.

Since the third peripheral region 101C adjacent to the transition edge 104 has a corner structure, the materials of the encapsulation layer 202 flow in a fixed direction, and the distribution of the materials may be uneven. By controlling the length directions of the first target through holes 105 to cross, the material of the encapsulation layer 202 can flow relatively evenly in various directions, so as to improve the uniformity of the distribution of the materials of the encapsulation layer 202.

As shown in FIG. 1, in some embodiments, an angle between the extension direction of the first target through hole 105 and the second direction is gradually increased in a direction from the first edge 102 to the second edge 103.

Referring to FIG. 1, in the third peripheral region 101C, the length directions of respective first target through holes 105 are different. It may be appreciated that at the position of the third peripheral region 101C near the first peripheral region 101A, the angle between the length direction of the first target through hole 105 and the second direction is minimum, which is almost zero degree; the angle between the length direction of the first target through hole 105 and the second direction is relatively large at a position of the third peripheral region 101C near the second peripheral region 101B, where the angle is almost 90 degrees; and in the direction from the first peripheral region 301A to the second peripheral region 301B, the length direction of each first target through hole 105 gradually changes from 0 degree to 90 degrees. It may also be appreciated that the first target through holes 105 of the third peripheral region 101C extend radially from a certain location near the display region AA as a center point to various locations of the transition edge 104 in a diffuse way.

In this way, by setting length directions of various first target through holes 105 being different, the plurality of diversion trenches extending in different directions are formed, which helps to improve the uniformity of the materials of the encapsulation layer 202 flowing in various directions.

In some embodiments, the length directions of the first target through holes 105 are perpendicular to the transition edge 104.

In the embodiment, the extension directions of the first through hole columns perpendicular to the transition edge 104 means that the directions of the first through hole columns are perpendicular to a corresponding tangential direction. It should be appreciated that, in the embodiments, the transition edge 104 is arc-shaped, the line along which each first through hole column extends has an intersection point with the transition edge 104, the transition edge 104 has a tangent line at the intersection point, and the tangent line is perpendicular to the line along which the first through hole column extends.

The controlling the extension directions of the first through hole columns to be perpendicular to the direction of the transition edge 104 is that the extension directions of the through holes are perpendicular to the direction of the transition edge 104, and it is conductive to improve the uniformity of the flows of the materials of the encapsulation layer 202 towards the transition edge 104.

It should be understood that mathematical perpendicularity is difficult to achieve in an actual product due to the limitation of process, production errors, and the like. The perpendicularity in the embodiments refers to directions remaining substantially perpendicular regardless of the process factors, errors that may exist, and the like. Similarly, the relevant definitions of arrangement near the straight line, extension along the first direction or the second direction, and the like in the embodiments are also given regardless of the limitations of the process factors and possible errors.

In some embodiments, the through hole columns include a second through hole located at the first edge 102, the second through hole includes second target through holes, cross sections of the second target through holes in the direction parallel to the base substrate 201 are of a long stripe shape, and length directions of the second target through holes are along the second direction.

In some embodiments, the through hole columns include a third through hole at the second edge 103, the third through hole includes third target through holes, cross sections of the third target through holes in the direction parallel to the base substrate 201 are of a long stripe shape, and length directions of the third target through holes are along the first direction.

In an embodiment, the length directions of various second target through holes are the same, the length directions of various third target through holes are the same, and the length direction of the second target through holes is different from the length direction of the third target through holes.

In an embodiment, the second target through holes correspond to the first edge 102, and the length direction of the first edge 102 is fixed and is the first direction, thus it is provided that the length directions of the second target through holes are the same and are along the second direction. In the present embodiment, it can also be understood that the length directions of the second target through holes are perpendicular to the first direction, so that the flow directions of the materials of the encapsulation layer 202 in the first peripheral region 101A are substantially uniform, thereby contributing to improving the uniformity of the thickness of the encapsulation layer 202 in the first peripheral region 101A.

Similarly, the length directions of the third target through holes are the same and along the first direction, it may be appreciated that the length directions of the third target through holes are perpendicular to the second direction, helping to improve the uniformity of the encapsulation layer 202 within the second peripheral region 101B.

In the embodiments, the first direction and the second direction are different directions. Illustratively, the display device is rectangular, the first edge 102 may refer to the left and right edges of the display device, the second edge 103 may refer to the upper and lower edges of the display device, and accordingly, the first direction and the second direction are perpendicular to each other. Obviously, when the structure of the display device changes, the positional relationship between the first direction and the second direction may also change.

The first direction is different from the second direction, accordingly, the length direction of the first target through hole 105 are different from the length direction of the second target through hole, so that the flow directions of the materials of the encapsulation layer 202 in the first peripheral region 301A and the second peripheral region 301B are also different, thereby improving the uniformity of the thickness of the encapsulation layer 202 in the first peripheral region 301A and the second peripheral region 301B.

As shown in FIG. 2, in some embodiments, the display substrate 100 includes the base substrate 201, and a first source-drain metal layer 203, a first planarization layer 204, a second source-drain metal layer 205, a second planarization layer 206, and a first electrode layer 207 that are stacked in sequence in a direction away from the base substrate 201. The encapsulation layer 202 is located on a side of the first electrode layer 207 away from the base substrate 201. In some embodiments, the display substrate 100 may not include the second source-drain metal layer and the second planarization layer.

As shown in FIG. 2, the display substrate 100 may further include a barrier layer 208, a buffer layer 209, an active layer 210, a first gate insulating layer 211, a first gate layer 212, a second gate insulating layer 213, a second gate layer 214, an interlayer dielectric layer 215, a pixel definition layer 216, a light-emitting layer 217, a second electrode layer 218, an encapsulation structure 209, a touch control module 220, etc. The pixel definition layer 216 may include a first pixel definition sub-layer 216a and a second pixel definition sub-layer 216b. A light-emitting unit of the display substrate 100 includes a first electrode layer 207, the light-emitting layer 217 and a second electrode layer 218. The encapsulation layer 202 is part of the encapsulation structure 209.

It may be appreciated that the structure of the display substrate 100 may be adjusted, for example, the display substrate 100 may have a double gate structure; and the display substrate may also have a single gate structure, and the second gate insulating layer 213 and the second gate layer 214, etc., are may be omitted. In implementation, the structure of the display substrate 100 can be configured according to specific requirements, which is not further limited herein.

Figure 3:
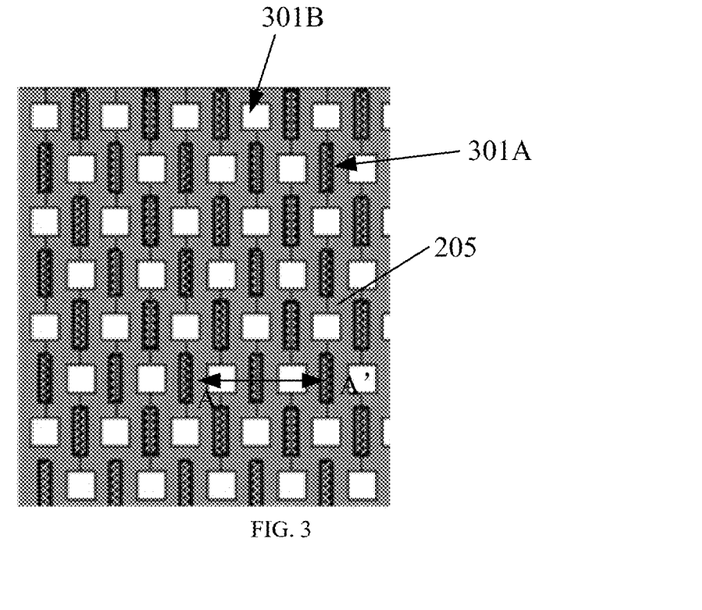
FIG. 3 is another schematic structural diagram of a display substrate in an embodiment of the present disclosure.

As shown in FIG. 3, in some embodiments, the through holes include a bridging hole 301A, and in some other embodiments, the through holes further include a vent hole 301B. The first target through holes 105, the second target through holes, and the third target through holes include the bridging hole 301A.

The vent hole 301B penetrates the source-drain metal layer. The source-drain metal layer in the embodiments can refer to the above-mentioned first source-drain metal layer 203. In the case where the display substrate 100 includes the above-mentioned second source-drain metal layer 205, the source-drain metal layer may also be the above-mentioned second source-drain metal layer 205 or both the first source-drain metal layer 203 and the second source-drain metal layer 205.

Figure 4:
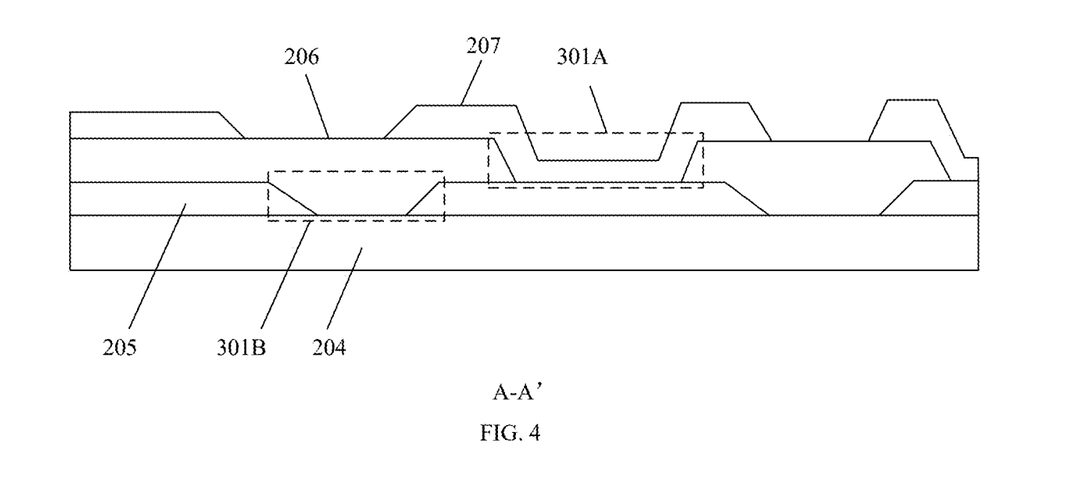
FIG. 4 is a sectional view along line A-A' in FIG. 3.

As shown in FIG. 3 and FIG. 4, the source-drain metal layer is exemplified as the second source-drain metal layer 205 for illustration.

When forming the second source-drain metal layer 205, a metal material is generally formed by evaporation, and the high temperature of the evaporation process may cause the organic material of the first planarization layer 204 located below the second source-drain metal layer 205 to partially evaporate, so as to generate vapor, and the generated vapor may cause the metal layer located above the first planarization layer 204 to peel off or fall off. Therefore, it is necessary to provide the vent hole 301B in the second source-drain metal layer 205 to release the vapor that may be generated.

The bridging hole 301A penetrates the second planarization layer 206, and the first electrode layer 207 is electrically connected to the second source-drain metal layer 205 through the bridging hole 301A. It should be appreciated that the first electrode layer 207 may be an anode of a light-emitting unit of the display substrate 100, and in order to ensure that the first electrode layer 207 may be normally connected to the second source-drain metal layer 205, the bridging hole 301A needs to be provided on the second planarization layer 206 so that the first electrode layer 207 is connected to the second source-drain metal layer 205 through the bridging hole 301A.

Taking the source-drain metal layer as the second source-drain metal layer 205 for example, the purpose of providing the bridging hole 301A is to expose the second source-drain metal layer 205 and to realize the electrical connection between the first electrode layer 207 and the second source-drain metal layer 205. However, the second source-drain metal layer 205 does not exist in the region corresponding to the vent hole 301B, so the position of the bridging hole 301A is influenced to some extent by the position of the vent hole 301B. It can be appreciated that an orthographic projection of the bridging hole 301A onto the base substrate 201 does not overlap an orthographic projection of the vent hole 301B onto the base substrate 201.

Figure 5:
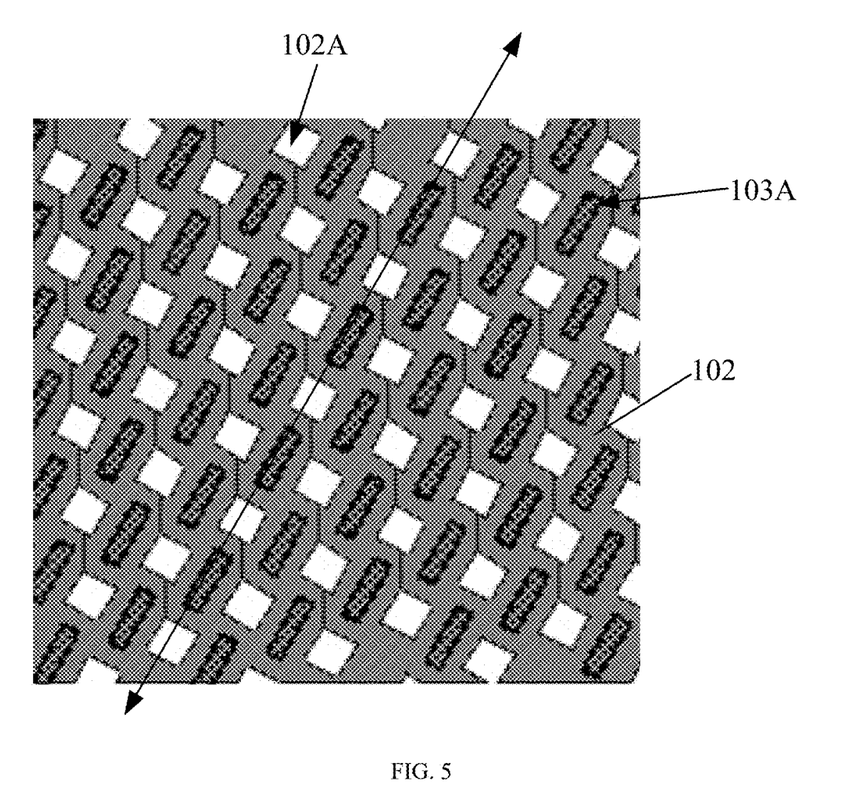
FIG. 5 is a schematic diagram illustrating an arrangement of vent holes and bridging holes in an embodiment of the present disclosure.

As shown in FIG. 5, a cross section of the bridging hole 301A in the direction parallel to the base substrate 201 is of the long strip shape, the through holes are arranged in columns and the formed through hole columns all extend along a straight line, and extension directions of the through hole columns are the same as the length direction of the bridging hole 301A. With reference to FIG. 5, the bridging holes 301A and the vent holes 301B that intersect with a double-arrow line in FIG. 5 form a through hole column. The direction of the double-arrow line in FIG. 5 also represents the extension direction of the through hole column, and the direction perpendicular to the double-arrow line represents the arrangement direction of the plurality of through hole columns.

In an optional embodiment, the vent hole 301B and the bridging hole 301A are arranged alternatively along the length direction of the through hole column, and the vent hole 301B and the bridging hole 301A are alternatively arranged along the arrangement direction of the through hole columns.

It may be appreciated that in each through hole column, one bridging hole 301A is arranged between two adjacent vent holes 301B, and one vent hole 301B is arranged between two adjacent bridging holes 301A. The adjacent two through hole columns are staggered, that is, the closest two through holes in the adjacent two through hole columns are the bridging hole 301A and the vent hole 301B, rather than the same through hole.

Figure 7:
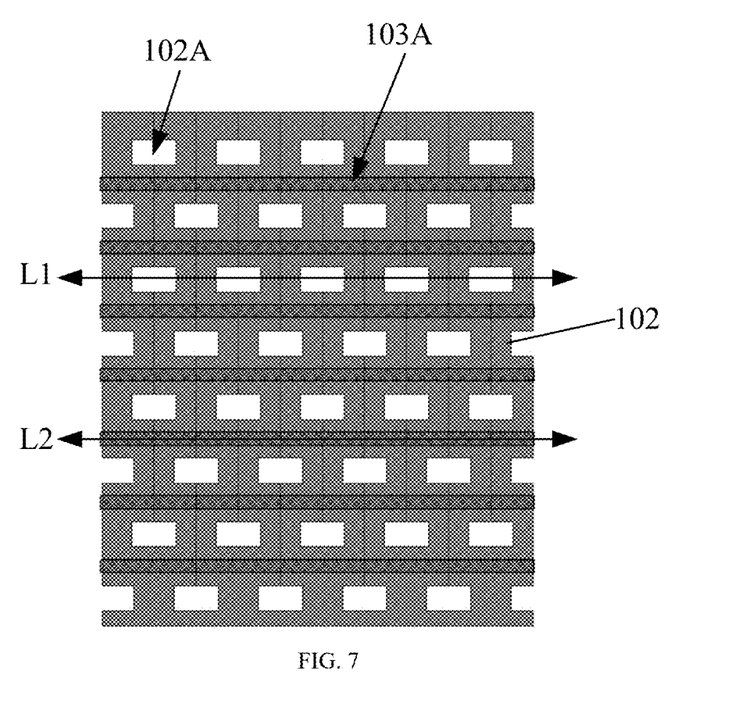
FIG. 7 is a schematic diagram illustrating another arrangement of vent holes and bridging holes in an embodiment of the present disclosure.

As shown in FIG. 7, in some embodiments, the through holes in each through hole column include one kind of the vent hole 301B and the bridging hole 301A, it can be understood that in each through hole column, only the vent hole 301B or the bridging hole 301A is included. In the present embodiments, a through hole column including only the vent hole 301B is referred to as a vent hole 301B column L1, and a through hole column including only the bridging hole 301A is also referred to as the bridging hole 301A column L2. In the arrangement direction of the through hole columns, the vent through hole 301B column L1 formed by the vent holes 301B and the bridging hole 301A column L2 formed by the bridging holes 301A are alternatively arranged.

Figure 6:
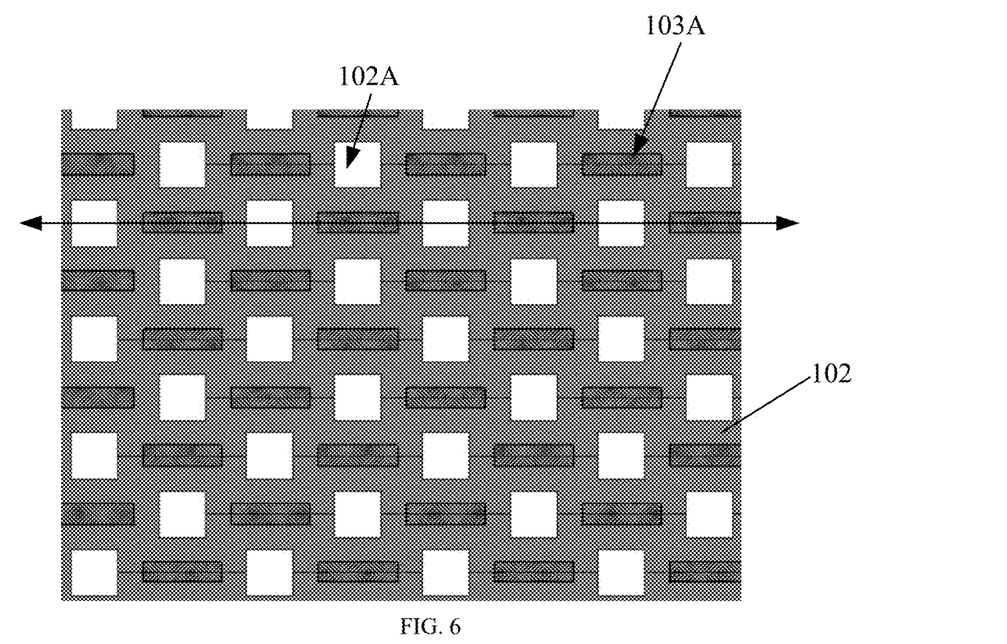
FIG. 6 is a schematic diagram illustrating another arrangement of vent holes and bridging holes in an embodiment of the present disclosure.

As shown in FIG. 6 and FIG. 7, in an optional embodiment, a cross section of the vent hole 301B in the direction parallel to the base substrate 201 is rectangular, and the cross section of the vent hole 301B includes a first central axis and a second central axis perpendicular to each other. The first central axis is arranged along the length direction of the through hole columns, and the second central axis is arranged along the arrangement direction of the through hole columns. The vent hole 301B may be square-shaped or rectangular-shaped.

It may be appreciated that the rectangular, square or rectangular shapes in the present embodiments mean that the shape of the vent hole 301B is substantially rectangular, square or rectangular regardless of certain errors and the process factors.

In some embodiments, at least part of the bridging holes 301A in the bridging hole 301A column L1 are connected and communicating with each other. Furthermore, in an embodiment, all the bridging holes 301A in each bridging hole 301A column L1 are connected and communicating with each other.

It should be appreciated that for some display substrates 100, for example display substrates 100 having a relatively large size, in order to reduce the connection resistance, it may be necessary to increase the overlapping area between the second source-drain metal layer 205 and the first electrode layer 207, i.e. the opening density and area of the bridging hole 301A need to be increased, accordingly, the flow ability of the materials of the encapsulation layer 202 may be reduced. In an embodiment, some or all of the bridging holes 301A in each bridging hole 301A column L1 may be controlled to communicate with each other, thereby helping to improve the flow effect of the materials of the encapsulation layer 202 along the bridging holes 301A, and helping to improve the flow effect of the materials of the encapsulation layer 202, so as to improve the uniformity of the thickness of the encapsulation layer 202.

In an optional embodiment, a cross-section of the vent hole 301B in the direction parallel to the base substrate 201 is of a long strip shape, and the vent holes 301B extend along the length direction of the through hole columns.

It can be understood that the length direction of the through hole column is consistent with the length direction of the vent hole 301B, and by increasing the length of the vent hole 301B, it is possible to improve the adaptability to the size of the vent hole 301B column LI and the bridging hole 301A column L2 and to improve the reliability of the display substrate 100.

Embodiments of the present disclosure further provides a display device, including the display substrate in any one of the above embodiments.

Since the display device of the present embodiments includes all the technical solutions of the above described embodiments about the display substrate 100, at least all the above described technical effects can be achieved, and the description thereof will not be repeated herein.

The above embodiments are merely specific implementations of the present disclosure, and the protection scope of the present disclosure is not limited thereto. Any modification and substitution be apparent to those skilled in the art without departing from the technical scope of the present disclosure shall fall within the protection scope of the present disclosure. Accordingly, the protection scope of the present disclosure is subjected to the claims.

What is claimed is:

1. A display substrate, comprising a display region and a peripheral region surrounding the display region, wherein the peripheral region comprises a first edge extending in a first direction, a second edge extending in a second direction and a transition edge between the first edge and the second edge, and the first direction and the second direction intersect; and wherein the display substrate comprises a base substrate and an encapsulation layer located on the base substrate, the display substrate further comprises a plurality of through holes, the through holes are located between the base substrate and the encapsulation layer, the through holes comprise a first through hole located at the transition edge, the first through hole comprises first target through holes, a cross section of each of the first target through holes in a direction parallel to the base substrate is of a long strip shape, and length directions of the first target through holes intersect with the first direction and the second direction;

wherein each of the first target through holes comprises a first boundary and a second boundary, a length of the first boundary is greater than a length of the second boundary, and an extension direction of the first boundary intersects with the first direction and the second direction;

wherein the length directions of at least some of the first target through holes intersect with each other;

wherein an angle between the length direction of the first target through holes and the second direction gradually increases from 0 degree to 90 degrees in a direction from the first edge to the second edge, and the first target through holes extend radially from a certain location near the display region as a center point to various locations of the transition edge in a diffuse way.

2. The display substrate according to claim 1, wherein the length directions of the first target through holes are perpendicular to the transition edge.

3. The display substrate according to claim 1, wherein the through holes further comprise a second through hole at the first edge, the second through hole comprises a second target through hole, a cross section of the second target through hole in the direction parallel to the base substrate is of a long strip shape, and a length direction of the second target through hole is along the second direction.

4. The display substrate according to claim 1, wherein the through holes further comprise a third through hole at the second edge, the third through hole comprises a third target through hole, a cross section of the third target through hole in the direction parallel to the base substrate is of a long strip shape, and a length direction of the third target through hole is along the first direction.

5. The display substrate according to claim 1, wherein the display substrate comprises the base substrate, and a first source-drain metal layer, a first planarization layer, a second source-drain metal layer, a second planarization layer, and a first electrode layer that are stacked in sequence in a direction away from the base substrate, and the encapsulation layer is located at a side of the first electrode layer away from the base substrate.

6. The display substrate according to claim 5, wherein the first target through hole comprises bridging holes, the bridging holes penetrate the second planarization layer, and the first electrode layer is electrically connected to the second source-drain metal layer through the bridging holes.

7. The display substrate according to claim 6, wherein the through holes further comprise vent holes, and the vent holes penetrate at least one of the first source-drain metal layer or the second source-drain metal layer.

8. The display substrate according to claim 7, wherein the through holes are arranged in columns along a straight line to form a plurality of through hole columns, the vent holes and the bridging holes are alternately arranged in an extending direction of the through hole columns, and the vent holes and the bridging holes are alternately arranged in an arrangement direction of the through hole columns.

9. The display substrate according to claim 8, wherein the through holes in each of the through hole columns comprise one kind of the vent holes and the bridging holes, and a vent hole column formed by the vent holes and a bridging hole column formed by the bridging holes are alternately arranged in the arrangement direction of the through hole columns.

10. The display substrate according to claim 9, wherein at least some of the bridging holes in each of the bridging hole columns are communicating with each other.

11. A display device, comprising the display substrate according to claim 1.

* * * * *